US010427331B2

(12) United States Patent
McLane et al.

(10) Patent No.: US 10,427,331 B2
(45) Date of Patent: Oct. 1, 2019

(54) SCALABLE MANUFACTURING OF SUPERHYDROPHOBIC STRUCTURES IN PLASTICS

(71) Applicants: The Regents of the University of California, Oakland, CA (US); VTT Technical Research Centre of Finland Ltd., Espoo (FI)

(72) Inventors: Jolie McLane, Newport Beach, CA (US); Michelle Khine, Irvine, CA (US); Ralph Liedert, Irvine, CA (US)

(73) Assignees: The Regents of the University of California, Oakland, CA (US); VTT Technical Research Centre of Finland Ltd., Espoo (FI)

( * ) Notice: Subject to any disclaimer, the term of this patent is extended or adjusted under 35 U.S.C. 154(b) by 783 days.

(21) Appl. No.: 14/964,295

(22) Filed: Dec. 9, 2015

(65) Prior Publication Data
US 2016/0158969 A1 Jun. 9, 2016

Related U.S. Application Data

(60) Provisional application No. 62/089,788, filed on Dec. 9, 2014.

(51) Int. Cl.
*B29C 33/38* (2006.01)
*B82Y 40/00* (2011.01)
(Continued)

(52) U.S. Cl.
CPC .... *B29C 33/3878* (2013.01); *B01L 3/502707* (2013.01); *B29C 59/04* (2013.01); *B82Y 30/00* (2013.01); *B82Y 40/00* (2013.01); *C23C 14/14* (2013.01); *C25D 1/10* (2013.01); *G03F 7/0002* (2013.01); *B01L 2200/12* (2013.01);
(Continued)

(58) Field of Classification Search
CPC .................................................. B29C 33/3878
See application file for complete search history.

(56) References Cited

U.S. PATENT DOCUMENTS

2005/0029701 A1 2/2005 Lin et al.
2013/0309450 A1 11/2013 Khine et al.

FOREIGN PATENT DOCUMENTS

WO WO 2013/131525 A1 9/2013

OTHER PUBLICATIONS

International Search Report in relate International Application No. PCT/US2015/064843, ISR dated Feb. 5, 2016.

*Primary Examiner* — Benjamin A Schiffman
(74) *Attorney, Agent, or Firm* — Knobbe, Martens, Olson & Bear LLP

(57) ABSTRACT

Disclosed are methods of manufacturing a SH surface including: creating a master with SH features by: depositing a rigid material onto a first surface, wherein the first surface is a shrinkable platform; shrinking the first surface by heating to create a SH surface, wherein the SH surface has micro- and nano-scale structural features that trap air pockets and prevent water from wetting the surface; forming the master by molding an epoxy with the shrunken first surface having a SH surface, wherein the master acquires the SH features of the first surface; and imprinting the SH features of the master onto a second surface to impart the SH features of the master onto the second surface. Some embodiments relate to a superhydrophobic (SH) surface, an article including a SH surface as disclosed, such as a microfluidic device or a food container.

11 Claims, 14 Drawing Sheets

(51) Int. Cl.
*G03F 7/00* (2006.01)
*C23C 14/14* (2006.01)
*B01L 3/00* (2006.01)
*B82Y 30/00* (2011.01)
*B29C 59/04* (2006.01)
*C25D 1/10* (2006.01)
*B29L 31/00* (2006.01)
*B29C 59/02* (2006.01)

(52) U.S. Cl.
CPC . *B01L 2300/087* (2013.01); *B01L 2300/0816* (2013.01); *B01L 2300/0887* (2013.01); *B01L 2300/123* (2013.01); *B01L 2300/166* (2013.01); *B29C 2059/023* (2013.01); *B29K 2905/00* (2013.01); *B29K 2905/14* (2013.01); *B29K 2995/0074* (2013.01); *B29K 2995/0093* (2013.01); *B29L 2031/712* (2013.01); *B29L 2031/7148* (2013.01); *B29L 2031/7532* (2013.01); *B29L 2031/7562* (2013.01)

SCALABLE MANUFACTURING OF SUPERHYDROPHOBIC STRUCTURES IN PLASTICS

STATEMENT REGARDING FEDERALLY SPONSORED R&D

This invention was made with government support under funds awarded by The National Institutes of Health (1DP2OD007283-01). The government has certain rights in the invention.

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The field includes scale-up manufacturing of roll-to-roll superhydrophobic surfaces and a manufacturing technique to deposit metals in a roll-to-roll platform on shrink film to achieve superhydrophobic features and emboss the features into commercial products.

Description of the Related Art

Superhydrophobicity can benefit many technical fields. Self-cleaning properties can help prevent the spread of disease for health applications. Low adhesion on a superhydrophobic surface can prevent bacterial growth and fouling. Superhydrophobic surfaces have a slip boundary and reduce drag, thus making them potential agents to coat boats or for use in fluid transport. Satellite dishes, solar cells, photovoltaics, heating and cooling systems, and windshields can benefit from superhydrophobic devices to improve efficiency.

Some superhydrophobic chemicals are on the market, such as NeverWet and Aculon. Some companies combine chemical (fluorocarbons) and structural modification to achieve superhydrophobicity. Sharklets mimics the structure of shark skin to achieve surfaces that prevent bacterial adhesion. Some research companies fabricate superhydrophobic features using micro and nanolithography.

Chemicals wear off and lose their hydrophobicity over time. Chemicals can also leach into their environment and become hazardous. The chemicals also adhere better to certain surfaces than others, preventing them from being used universally. Products using chemicals often must pass FDA approval before being used as a commercial product. Some structures that prevent bacterial adhesion (such as Sharklets) are not superhydrophobic and do not have all the benefits of superhydrophobic surfaces. Fabricating a purely structural superhydrophobic master can be complex and require photolithography, nanolithography, electrospinning, etching, gels, colloids, oxidizers, carbon nanotubes, self-assembly, etc.

SUMMARY OF THE INVENTION

Some embodiments relate to a method of manufacturing a SH surface comprising:
creating a master with SH features by:
depositing a rigid material onto a first surface, wherein the first surface is a shrinkable platform;
shrinking the first surface by heating to create a SH surface, wherein the SH features comprise micro- and nano-scale structures that trap air pockets and prevent water from wetting the surface;
forming the master by contacting a master material with the shrunken first surface having a SH surface and hardening the master material while in contact with the shrunken first surface, wherein master material solidifies and acquires the SH features of the first surface; and
imprinting the SH features of the master onto a second surface to impart the SH features of the master onto the second surface.

In some embodiments, the rigid material comprises a metal.

In some embodiments, the metal is gold or silver.

In some embodiments, the rigid material comprises calcium.

In some embodiments, the rigid material comprises a combination of silver and calcium.

In some embodiments, the rigid material is vapor-deposited onto the first surface.

In some embodiments, the master material is selected from the group consisting of nickel, polydimethylsiloxane (PDMS), ormocer and spurr.

In some embodiments, the master is formed by electroplating nickel onto the SH surface.

In some embodiments, the imprinting is done by hot embossing of the second surface with the master.

In some embodiments, the first surface is a polyolefin (PO).

In some embodiments, the second surface is a hard plastic.

In some embodiments, a master is repetitively imprinted onto the second surface at adjacent positions to seamlessly transfer the SH features of the master to the second surface.

In some embodiments, the SH features of a master are imprinted onto the second surface by roll-to-roll processing.

Some embodiments relate to a superhydrophobic (SH) surface, wherein the SH surface has micro- and nano-scale features. These features can trap air pockets and prevent water from wetting the surface. The micro- and nano-scale features of the SH surface can be formed by micro- and nano-scale structural features of a corresponding manufacturing master mold configured to create the micro- and nano-scale structural features of the SH surface.

In some embodiments, the SH surface is formed on a surface of a hard plastic.

In some embodiments, the SH surface comprises polypropylene.

In some embodiments, the surface is not chemically modified to achieve the micro- and nano-scale features.

In some embodiments, the SH surface has a surface area of from $0.5$ mm$^2$-$1$ m$^2$.

Some embodiments relate to an article comprising a SH surface disclosed herein.

Some embodiments relate to a microfluidic device comprising a SH surface disclosed herein.

Some embodiments relate to an article of manufacture, comprising:
a layer of flexible material having a first end and a second end; and
an exposed surface having a surface texture comprising an expanse of hydrophobicity inducing features, the features having micro- and/or nano-scale dimensions, wherein the expanse provides a contact angle of at least 150 degrees and/or a sliding angle of less than 10 degrees.

In some embodiments, the hydrophobicity inducing features comprise wrinkles.

In some embodiments, the hydrophobicity inducing features comprise invaginations.

In some articles, a length of the layer from the first end to the second end exceeds 1 meter.

Some embodiments relate to a microfluidic device, comprising an article of manufacture disclosed herein.

Some embodiments relate to a food container comprising a volume defined by at least one wall comprising the article of manufacture disclosed herein.

BRIEF DESCRIPTION OF THE DRAWINGS

These and other features, aspects and advantages are described below with reference to the drawings, which are intended to illustrate but not to limit the inventions. In the drawings, like reference characters denote corresponding features consistently throughout similar embodiments. The following is a brief description of each of the drawings.

DETAILED DESCRIPTION OF CERTAIN PREFERRED EMBODIMENTS

Figure 1:
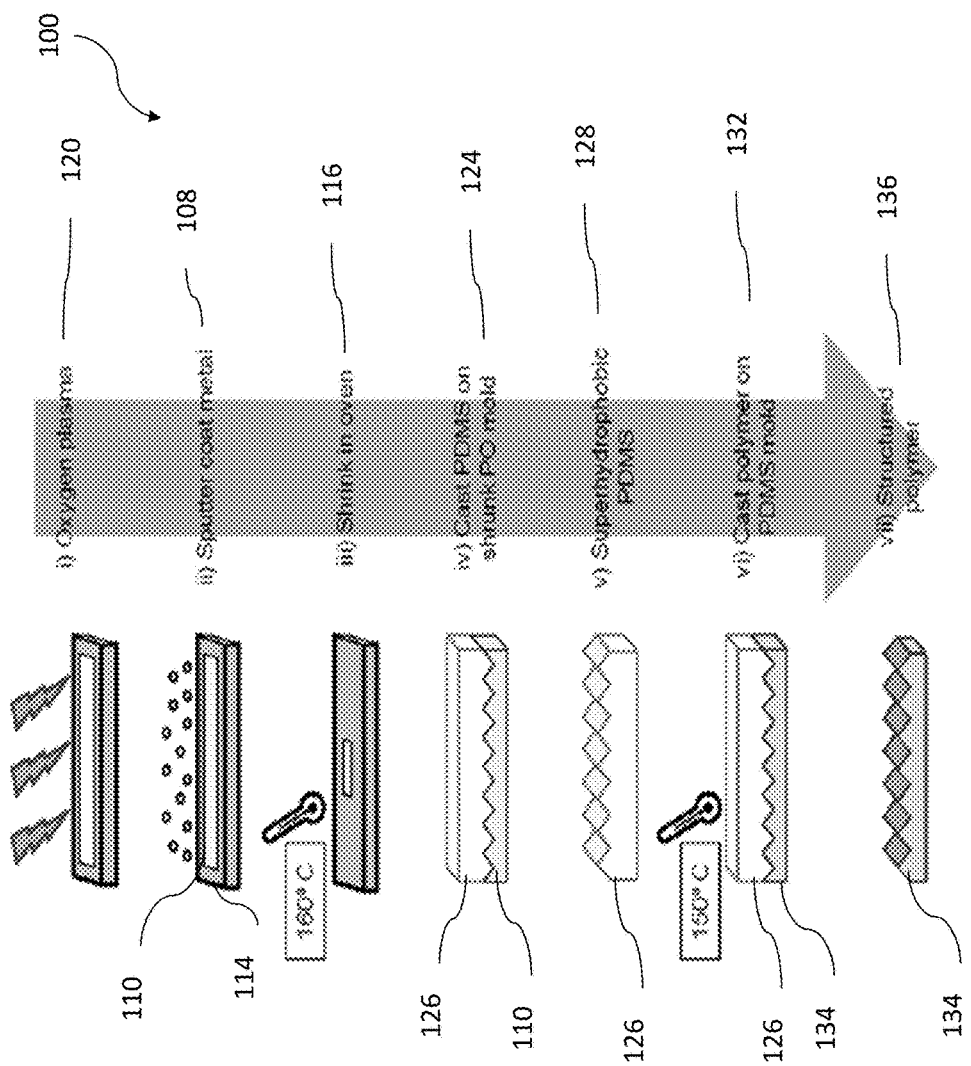
FIG. 1 shows a fabrication method for producing a structured polymer.

Superhydrophobic (SH) surfaces are used for many applications because of their unique behavior. Water beads up on a SH surface, has a weak adhesion to the SH surface, and slides rather than adheres to the surfaces. When a water droplet evaporates on a SH surface, the weak adhesion allows the footprint of the droplet to continually shrink until the fluid completely evaporates. During evaporation, molecules are concentrated and confined to a smaller final footprint, thus enhancing the concentration of molecules compared a flat surface.

Further, the SH surfaces disclosed herein can be used to create self-driven microfluidic devices. When a SH surface is patterned with superhydrophilic regions, fluid will only wet the superhydrophilic regions and not wet the SH regions. Thus, flow can be driven by a high contrast in wettability rather than an external source. Because these channels are self-driven, open-channels can be provided, negating the need for external equipment that may otherwise be required to induce flow in the channels of the microfluidic devices. In addition, the SH surfaces are also phobic to bodily fluids such as blood, saliva, and urine, and thus these fluids can be used as a sample on the SH surfaces as can a water-based sample. Thus, in some embodiments, the self-driven microfluidic constructs can be combined with the use of sample concentration to enhance limit-of-detection in a portable analyzer, such as a point-of-care (POC) device. In such devices, bodily fluids can be advantageously tested.

The SH surfaces can be created using a structural modification. The structural modification creates topography that induces hydrophobicity or reduced wettability. In one embodiment, the topography includes local elevated areas, or peaks, that reduce wettability or enhance hydrophobicity. A fluid droplet sits on a surface which has been structurally modified to have peaks. Minimal interaction of a fluid droplet and a SH surface results in minimal adhesion. During evaporation, liquid evaporates into the atmosphere at the air-liquid interface of the droplet, and the surface tension locally increases at the surface of the water droplet. This increase in surface tension is great enough to depin the fluid droplet from the SH surface and to pull the footprint (contact area where the droplet attaches to the SH surface) of the droplet inward. In this context, "depin" means that the water droplet's contact line (outer circumference where the droplet attaches to the surface) detaches from the surface because the droplet's surface tension is greater than the adhesion or attractive force between the droplet and the SH surface. When the molecules in the water relax and tension is balanced due to depinning, the droplet repins to another peak of the SH surface. In this context, "repin" means that the weak adhesion or attractive force between the SH surface and the droplet is a strong enough to reattach to the water droplet's contact line and hold the droplet in its ball-like shape. This depinning and repining continues until the surface tension is not stronger than the pinning force. The fluid eventually completely evaporates in the atmosphere, and only the dry contents of the droplet are left on the surface. Thus, molecules in the droplet are concentrated, and due to a decrease in footprint size, the concentration effect is greater on a SH surface compared to a flat surface or other surface with higher wettability or lesser hydrophobicity.

A surface is considered superhydrophobic (SH) when water prefers to bead up and roll off the surface rather than wet the surface (Cassie, A. B. D. and Baxter 1944 S. *Faraday Soc.* 40: 546-551; Cheng, Y. T. et al, 2006 *Nanotechnology* 17: 1359-1362; Cortese, B. et al. 2007 *Langmuir* 24: 2712-2718; Gomez, G. B. et al. 2010 *Langmuir* 26: 7248-7253; Ma, M. et al. 2006 *Coll. Inter. Sci* 11: 193-202; Öner, D. et al. 2000 *Langmuir* 16: 3453-3456; and Zhu, L. et al. 2005 *Langmuir* 21: 11208-11212). More specifically, a SH surface has a water contact angle (CA) greater than 150° and a sliding angle (SA) less than 10°. This unique behavior of water can be caused by the high surface tension of water, the low surface energy of the substrate, and the minimal adhesion between water and the surface. The low surface energy and minimal adhesion can be provided by multiscale features, ranging from micro (micrometer) to nano (nanometer) (Cheng, Y. T. et al, 2006 *Nanotechnology* 17: 1359-1362). This hierarchy or combination of features traps air pockets between the surface and water, and the water droplet only contacts the peaks of the multiscale structures. Both micro- and nano-scale features are advantageous in achieving superhydrophobicity.

In some embodiments, the micrometer-scaled features include folds having heights of from 2-10 including heights of 2 μm, 3 μm, 4 μm, 5 μm, 6 μm, 7 μm, 8 μm, 9 μm, 10 μm. The height of the folds is typically within 2-10× greater than peak-to-peak widths, including configurations where the heights of the folds may be 2×, 3×, 4×, 5×, 6×, 7×, 8×, 9× 10× greater than peak-to-peak widths.

In some embodiments, the nanometer-scaled features located on the folds may include indentations or protrusions in the surface of the folds, wherein the indentations and/or protrusions have depths and/or widths of 5 nm to 1000 nm, including indentations or protrusions having depths and/or widths of about 5 nm, 10 nm, 20 nm, 40 nm, 50 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm and 1000 nm.

Superhydrophobic Master Surfaces

Although the SH surfaces and structure discussed above are very useful, it would be advantageous to be able to produce these surfaces and structures quickly and in high volume. Such a model would facilitate more applications of this technology, as discussed below.

FIG. 1 illustrates a method 100 in which superhydrophobic master surfaces are created. Step 108 includes depositing a metal 110, e.g., silver and/or gold, onto a heat sensitive polymer substrate 114. The step 108 can involve sputter coating metal and other similar processes. After depositing the metal 110, the substrate 114 with metal deposited thereupon is shrunk in step 116 in at least one direction, e.g., in two directions. In some variations of the method 100, the substrate 114 is treated in a step 120 prior to deposition to enhance adhesion of the metal thereto. The substrate can be treated in the step 120 with oxygen plasma. After the optional treatment in step 120, the substrate 114 can be coated with a metal (e.g., sputter coated), and then heat shrunk in an oven in the step 116. A superhydrophobic surface is created upon shrinking of the polymer substrate 114 and metal 110 deposited thereupon. The SH surface having micro- and nano-scale features is provided after step 116. As discussed above, when present, micro- and/or nano-scale features can trap air pockets and prevent water from wetting the surface.

In a step 124 a master shim 126 can be formed by molding an epoxy (e.g., PDMS) with the shrunken surface or substrate 114 having a SH surface, e.g., a textured surface formed of the metal 110. Molding with the epoxy can be accomplished by spreading the epoxy over the surface formed in the step 116 and thereafter curing the epoxy such that is forms a solid surface complementary to the surface created after the step 116. Once the epoxy is cured, the master 126 acquires the SH features from the substrate 114.

In a step 128, the master shim is disengaged from the metal/heat-sensitive polymer substrate. In step 132, the SH features of the master shim 126 (e.g., PDMS) are imparted or cast onto a second surface 134.

In some embodiments, a "microsoap" or a coating fluid may be inserted between a master shim and the second material in the method between step 128 and step 132. The function of this layer is to facilitate disengagement or lift off of master shim from a heat embossed or an imprinted surface. Such a microsoap or coating fluid facilitates dissociation of micro-scaled and nano-scaled features, where undercuts might otherwise resist dissociation from a master shim. An undercut is any indentation or protrusion in a shape that prevents its withdrawal from a mold. Undercuts are expected to frequently occur in the metal layer 110.

If hot embossing is used to transfer the SH features on the master to the plastic, the process can be conducted at an elevated temperature, e.g., at 150° C. or higher. In another embodiment, the process can be conducted at an elevated temperature of 110° C., 120° C., 130° C., 140° C., 150° C., 160° C., 170° C., 180° C., 190° C., 200° C., 210° C., 220° C., 230° C., 240° C., 250° C., 260° C., 270° C., 280° C., 290° C. or 300° C.

After the SH features are transferred to the second surface 134 which can be a polymer, the master shim 126 is separated in a step 136 from the second surface 134. The second surface 134, e.g., hard plastic can then be used independently or incorporated into an article that operates by exploiting a SH surface or a surface with low wettability, such as any of those articles described herein.

Unlike many commercial superhydrophobic surface coatings, the surface patterning technology disclosed herein arises primarily from topographical or surface roughness effects (e.g., where no surface chemistry based effects are required). In other embodiments, a combination of topographical and chemical contributors to superhydrophobicity is provided.

Superhydrophobic surfaces may be characterized with regard to contact angle, solid fraction and sliding angle, according to the Cassie-Baxter equation:

$$\cos \theta_C = \phi \cos \theta_Y + \phi - 1$$

where,
$\theta_C$=contact angle,
$\phi$=solid fraction, and
$\theta_Y$=contact angle from the Young equation.

Contact angles, $\theta_C$ and $\theta_Y$, and solid fraction values are show for a variety of polymers in Table 1.

TABLE 1

Contact Angle and Solid Fraction Values

| Material | $\theta_C$ (°) | $\theta_Y$ (°) | $\phi$ |
|---|---|---|---|
| PDMS | 152 | 108 | 0.17 |
| PS | 145 | 70 | 0.14 |
| PC | 151 | 95 | 0.14 |
| PE | 155 | 87 | 0.09 |

Figure 2:
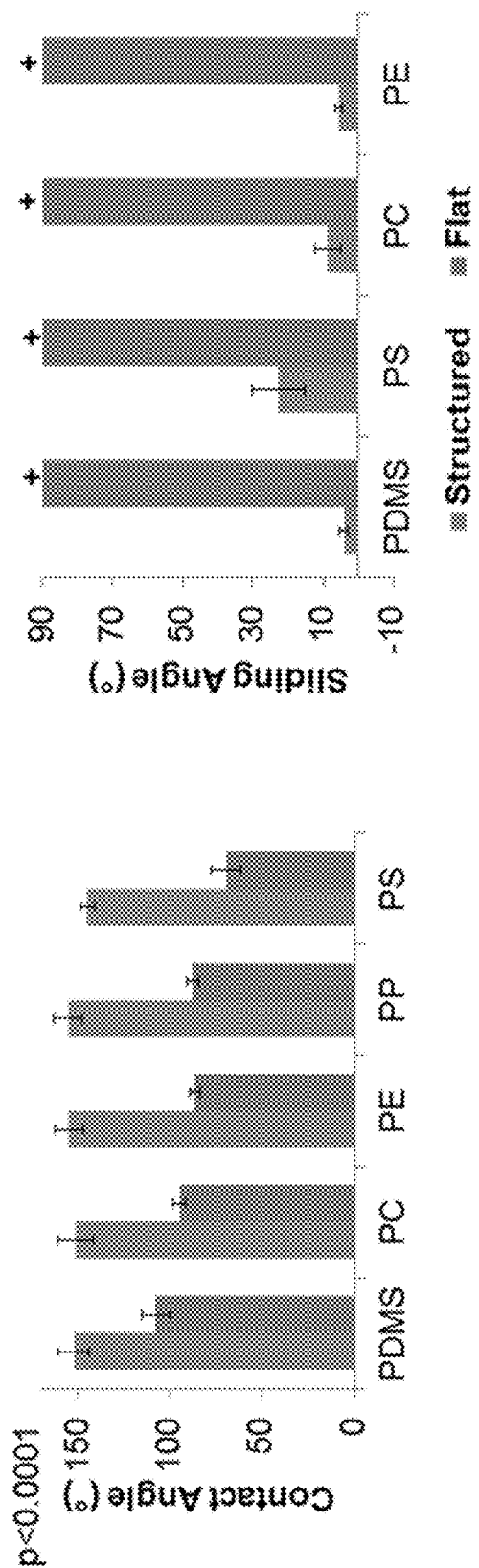
FIG. 2 compares contact angles and sliding angles for representative polymers having either a flat surface configuration or a structured surface providing superhydrophobic characteristics.

Referring to FIG. 2, contact angles and sliding angles are shown for a representative set of plastic polymers. As noted above, PDMS is one of a class of materials that can be formed with micro- and/or nano-scale topological geometries and can thereafter be used to appropriately replicate these features in plastic, e.g., at elevated temperature processing, such as in hot embossing. PS, PC, and PE are materials that can be embossed or imprinted at elevated temperatures using a patterned surface formed on PDMS or other suitable material.

Production of Articles Having Superhydrophobic Surfaces

Many materials may have SH features imprinted onto their surface. Such materials include plastics (e.g., poly(methyl methacrylate)), metals (e.g., aluminum, copper, tin) and glass (silicon dioxide).

Figure 3:
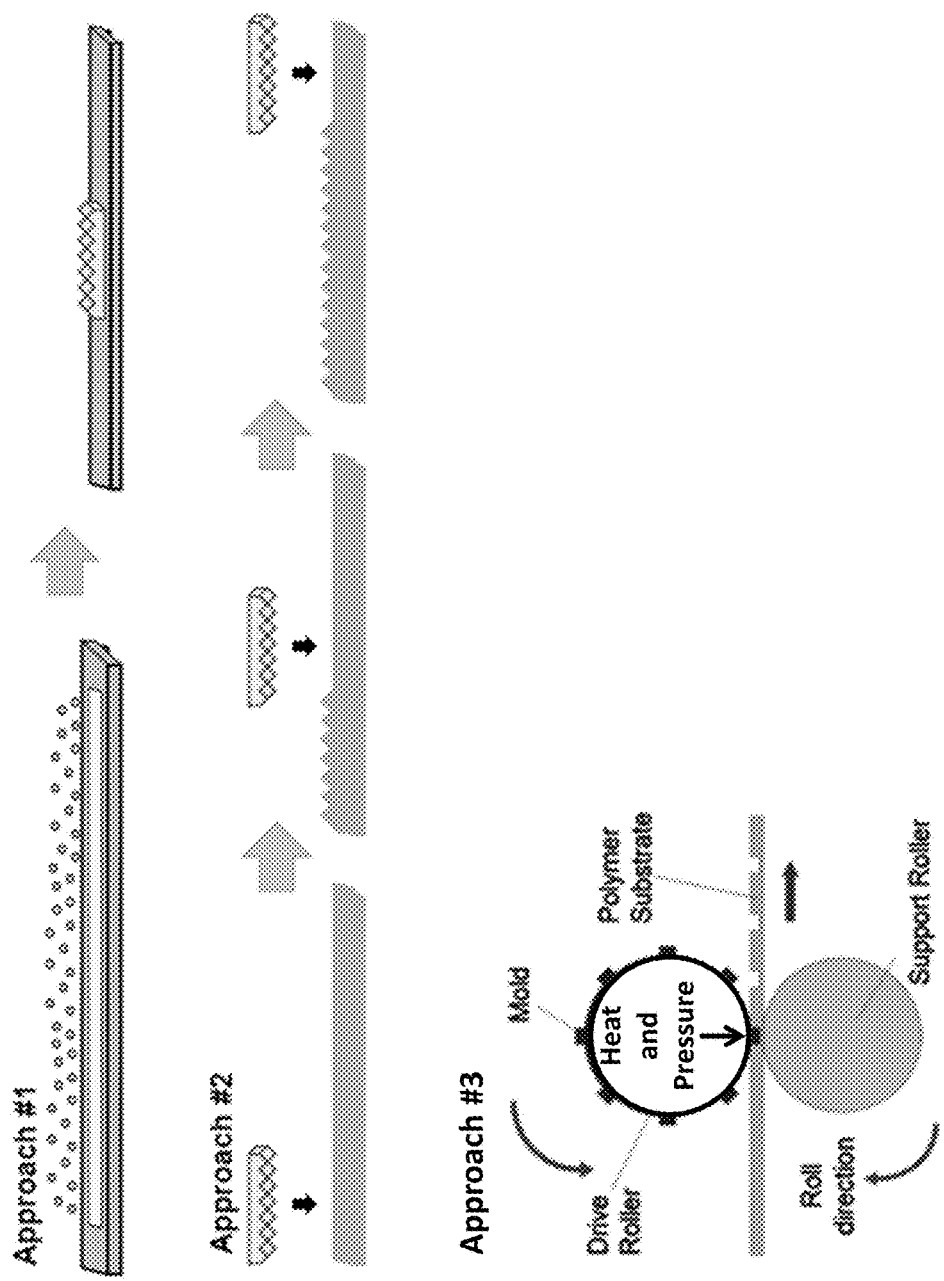
FIG. 3 shows three example approaches to manufacture of large samples of shrink-induced superhydrophobic ("SH") surfaces. As discussed further below, in Approach #1, a SH surface is generated by depositing metal on a heat sensitive substrate, followed by heat shrinkage of the substrate and metal deposited thereupon. The metal adopts features that trap air pockets. The features that trap air pockets can include micro- and/or nano-scale features. The air trapping features prevent water from wetting the surface. In Approach #2, a master (e.g., a nickel or an epoxy master) is prepared by adding nickel or an epoxy to a SH surface generated by Approach #1. The master, which has complementary features, e.g., micro- and nano-scale features, compared to the original SH surface, can be used to repetitively imprint such SH features (e.g., micro- and nano-scale SH features) onto a product surface. This results, in some embodiments, in seamlessly stitching together the SH features. In Approach #3, these methods can use stamping or roll-to-roll techniques.

FIG. 3 illustrates a variety of techniques for the formation of useful topographies for inducing SH properties. In some embodiments, a SH surface is generated by depositing metal on a heat sensitive substrate, followed by heat shrinkage of the substrate and metal deposited thereupon (graphically illustrated in FIG. 3 as "Approach #1"). The metal wrinkles and thereby adopts micro- and/or nano-scale features. These features are configured to trap air pockets and prevent water from wetting the surface. For commercial applications, the technology can be scaled up in a way that is compatible with large scale manufacturing. For example, in some embodiments, a master having SH features can impart the SH features onto a product surface by repetitive stamping of the master onto the product surface (graphically illustrated in FIG. 3 as "Approach #2"). In other embodiments, roll-to-roll deposition may be used to impart SH features over large surfaces of products (graphically illustrated in FIG. 3 as Approach #3).

In some embodiments, a SH surface is from 0.5 mm$^2$-5 cm$^2$. In other embodiments, the SH surface has a surface area of from 5 cm$^2$-1 m$^2$. A smaller SH surface may be imprinted with a master and can have surface are of 0.5 mm$^2$, 1 mm$^2$, 2 mm$^2$, 4 mm$^2$, 5 mm$^2$, 10 mm$^2$, 0.5 cm$^2$, 1 cm$^2$, 2 cm$^2$, 3 cm$^2$, 4 cm$^2$, 5 cm$^2$. A larger SH surface may be manufactured by roll-to-roll deposition and may have a surface are of 5 cm$^2$, 10 cm$^2$, 15 cm$^2$, 20 cm$^2$, 30 cm$^2$, 50 cm$^2$, 100 cm$^2$, 200 cm$^2$, 400 cm$^2$, 0.5 m$^2$, 0.6 mm$^2$, 0.7 m$^2$, 0.8 mm$^2$, 0.9 m$^2$ and 1 m$^2$ or more.

Depending on the surface of the article, the SH surface may be visibly transparent or it may be opaque. Opacity is the measure of impenetrability to electromagnetic or other kinds of radiation, especially visible light. Transparency of certain articles, such as a windshield or an optical lens, is advantageous or necessary.

Roll-to-Roll Deposition

Materials other than metals may be used to generate SH features following shrinkage of a surface layer of the material. For instance, gold may be replaced with a material compatible with roll-to-roll (R2R) deposition equipment. For example, gold can be replaced with silver and calcium. Silver and calcium can be deposited using a roll-to-roll deposition platform. Due to the difference in stiffness of gold and calcium, the thickness of calcium deposited is adjusted to ensure that superhydrophobic features are achieved during the shrinking process. The combination of silver and calcium yields superhydrophobic features when the plastic film is shrunk.

In some embodiments, gold is not a viable material to deposit R2R. Because a bimetallic layer is necessary to form SH wrinkles, a combination of materials compatible with R2R deposition may be used. In some embodiment, silver (Ag) and calcium (Ca) are deposited on a heat-sensitive substrate. In some embodiments, the heat-sensitive substrate may be pre-stressed polystyrene (PS). A silver layer is deposited first onto the substrate, followed by layer of calcium. For example, silver can be thermally evaporated and then condensed onto the substrate. Similarly, solid calcium can be thermally evaporated and condensed onto the silver. The ratio of silver:calcium may be from 2-10, e.g., 2, 3, 4, 5, 6, 7, 8, 9 or 10.

We also disclose depositing silver and calcium roll-to-roll, wherein silver and calcium are deposited sequentially using a roll-to-roll platform, thus creating a large area coated with the silver and calcium. If a sufficiently large area of a substrate with metal or silver and calcium deposited thereon is produced by a roll-to-roll process, the size-reduced substrate with SH features may be sufficiently large to be placed on a drive roller in a roll-to-roll apparatus used to continuously imprint SH features onto a product surface. In other embodiments, smaller master shim sections can be seamlessly stitched together to cover a drive roller in a roll-to-roll apparatus.

One type of material used to make a master is polydimethylsiloxane (PDMS). In some embodiments, it is beneficial to replace PDMS with a material capable of large scale imprinting into hard plastics on a roll-to-roll platform. For example, a master having superhydrophobic features could comprise ormocer epoxy, wherein the ormocer has molded the superhydrophobic features. Ormocer may be useful because such materials can be placed directly on a roller to imprint superhydrophobic features into hard plastics on a roll-to-roll platform. Using this method, SH surface production could be scaled to mass production.

In preferred embodiments, particularly in roll-to-roll manufacture of SH products, a master shim is made of nickel. A nickel master may be generated by initially depositing a metal "seed layer," e.g., gold or silver, onto a heat-sensitive substrate (e.g., polystyrene). Upon heat treatment and formation of a SH surface, the metal surface is electroplated with nickel, forming a nickel layer. Electroplating is a process that uses electric current to reduce dissolved metal cations (e.g., $Ni^{2+}$) so that they form a coherent metal coating on an electrode. The initial gold or silver layer, which has SH structural features, acts as a cathode to attract $Ni^{2+}$ ions. The cathode supplies electrons to the positively charged $Ni^{2+}$ cations which flow to it from an electrolyte-containing solution.

In some embodiments, the nickel layer formed by electroplating is 50 µm-5 mm thick, including thicknesses of 100 µm, 200 µm, 300 µm, 400 µm, 500 µm, 600 µm, 700 µm, 800 µm, 900 µm, 1000 µm, 1.1 mm, 1.2 mm, 1.3 mm, 1.4 mm, 1.5 mm, 1.6 mm, 1.7 mm, 1.8 mm, 1.9 mm, 2.0 mm, 2.5 mm, 3.0 mm, 3.5 mm, 4.0 mm, 4.5 mm or 5 mm, or any range there-between.

We have successfully imprinted the superhydrophobic (SH) features from SH polydimethylsiloxane (PDMS) into the hard, low viscosity epoxy resin spurr. Unlike other epoxies, Spurr resin, having a viscosity of about 60 centipoise, readily penetrates microscopic features and a variety of surfaces, including hard tissue, rocks, and other minerals. Molded spurr can be used to transfer the SH features into hard plastics such as polypropylene (PP).

Due to its low viscosity, spurr can be used to mold micro- and/or nanoscale structures (such as the SH features). Spurr can also bond to traditional epoxy resins and can therefore be used as a master shim to imprint SH features into hard plastics in a roll-to-roll (R2R) platform. A thin layer of spurr can also be imprinted with the SH features to create a SH coating on another surface.

Roll-to-roll processing, also known as web processing, reel-to-reel processing or R2R, is the process of creating devices on a roll of flexible plastic or metal foil. It can refer to any process of applying coatings, printing, or performing other processes, starting with a roll of a flexible material, and re-reeling after the process to create an output roll. These processes can be grouped together under the general term converting. Once the rolls of material have been coated, laminated or printed, they are normally slit to their finished size on a slitter rewinder. R2R hot embossing is a suitable high-volume manufacturing method for superhydrophobization of any deformable surface (e.g., food cartons, textile coatings, inner surfaces of tubing and blood transport containers, medical implants, boats, bathroom surfaces and hospital surfaces).

We have previously created superhydrophobic surfaces using metal and shrink film in a static method. In a scaled up version of this method, large area superhydrophobic surfaces are manufactured on a mass scale. Silver and calcium are advantageously deposited on shrink film in a roll-to-roll platform. When the shrink film is heated and shrunk, structural superhydrophobic features are created, which can subsequently be imprinted into any inherently hydrophobic silicone or plastic to achieve superhydrophobicity. For example, the hard epoxy ormocer may be used as an intermediate to transfer the superhydrophobic features into hard plastics in a roll-to-roll platform. The epoxy resin spur can also be used as an intermediate to transfer the SH features into hard plastics in a R2R platform.

We have previously developed fabrication techniques to create a small area master with superhydrophobic features. As a novel development, we have scaled up the fabrication process by depositing metal on shrink film in a roll-to-roll platform to make it more compatible with mass manufacturing.

Superhydrophobic (SH) surfaces are created in hard plastics by forming micro- to nanoscale hierarchical wrinkles using commodity shrink film and are compatible with scale-up technique. This low-cost fabrication technique is a purely structural modification, allowing any plastic to easily become SH for commercial applications such as enhanced detection, microfluidics, and education.

Superhydrophobicity is achieved when the contact angle (CA) exceeds 150° and the sliding angle (SA) is reduced to less than 10°. Micro- to nanoscale structures at the SH surface trap air pockets between the fluid and the surface, and the droplet has minimal adhesion with the surface, allowing the droplet to glide across the surface. When fluid evaporates on a SH surface, the droplet's contact area continually decreases due this weak adhesion, and eventually, the droplet collapses to a small footprint when evaporation is complete. Molecules in solution concentrate during evaporation, and lower concentrations can be detected using simple detection techniques.

Evaporation on a SH surface enhances detection because molecules are concentrated. Bovine serum albumin (BSA) is detected using a colorimetric assay as low as 5 µg/mL, a 160× improvement compared to controls. Using one sample collection, protein levels indicative or pre-eclampsia can be detected and are distinguishable from normal patient protein levels. This device is simple to use, requires no external equipment, and can be scaled up for mass production.

SH surfaces are desirable because of water's unique behavior on these surfaces. SH surfaces have micro- and nanoscale features that trap air pockets and prevent water from wetting the surface. Rather, a water droplet beads up and rolls off the SH surface due to the weak surface adhesion.

To reap the benefits of SH surfaces in everyday life, SH surfaces advantageously can be produced quickly and at an affordable price. Roll-to-roll (R2R) production is an attractive platform to produce the SH surfaces in plastics.

We have successfully achieved SH features at a small scale and are scaling up production to achieve large areas of SH surfaces in a quick manner. We are utilizing R2R manufacturing techniques to emboss the SH features into hard plastics.

To scale up production, we are making a larger master to imprint larger SH pieces. Large area SH samples have been created successfully. Combinations of compatible metals to deposit on the surface have been determined and yield SH features upon shrinking (e.g., have similar young's modulus and thickness to the small scale samples). This combination of metals has been deposited, shrunk, and characterized, and SH features are achieved. These SH features have been successfully transferred into silicones and hard plastics to achieve SH surfaces. The metals have been deposited on multiple shrink films and have also been deposited in a R2R platform.

We have developed a material to use as a master shim for hot embossing into hard plastics R2R. Shims must have enough strength to achieve multiple replicates and not degrade over multiple molds. This master shim seamlessly stamps the SH features into a continuous sheet of plastic.

Both these methods can yield SH features in multiple hard plastic with high throughput and at low cost.

Large areas can be created on the roll-to-roll metal deposition platform. Metal deposition can also be patterned using compatible printing technology. Ink can be printed and selectively block metal deposition, and superhydrophobic regions can be patterned against flat plastic regions.

Spurr Epoxy Resin

The use of Spurr is advantageous for at least two reasons. Firstly, the SH spurr can bond to a shim for R2R embossing into hard plastics. Secondly, the SH features can be imprinted into a thin layer of spurr coated on another surface, and virtually make any material superhydrophobic.

Previously, SH features have been created in PDMS by creating micro- to nanoscale features in shrink film due to the stiffness mismatch of metal. Then, we have transferred the features into PDMS. The SH PDMS is used to cast the SH features into spurr. Spurr (Serva Electrophoresis) is created by mixing the four components (D.E.R. 736, ERL 4221D, NSA, and DMAE). The uncured spurr liquid is poured on top of the SH PDMS mold, vacuumed to remove air bubbles between the spurr and PDMS interface, and cured overnight at 70° C. Next, the spurr is removed from the SH PDMS surface, and spurr can be used as a shim to imprint the SH features into hard plastics by R2R hot embossing.

Additionally, the spurr can be used as a SH coating on surfaces that cannot be directly imprinted with the SH features. Spurr is created by mixing the four components, then a thin layer is deposited on the surface. Spurr can be deposited using multiple methods including (but not limited to) spin deposition, dropping a thin layer on a surface, blade cutting to achieve a thin layer, and dipping. Spurr can be partially cured at various temperatures and times. The SH PDMS can be used as a master to imprint the SH features into the spurr, and the spurr can be fully cured with the SH features. Thus, a coating of SH spurr can be achieved.

Figure 4:
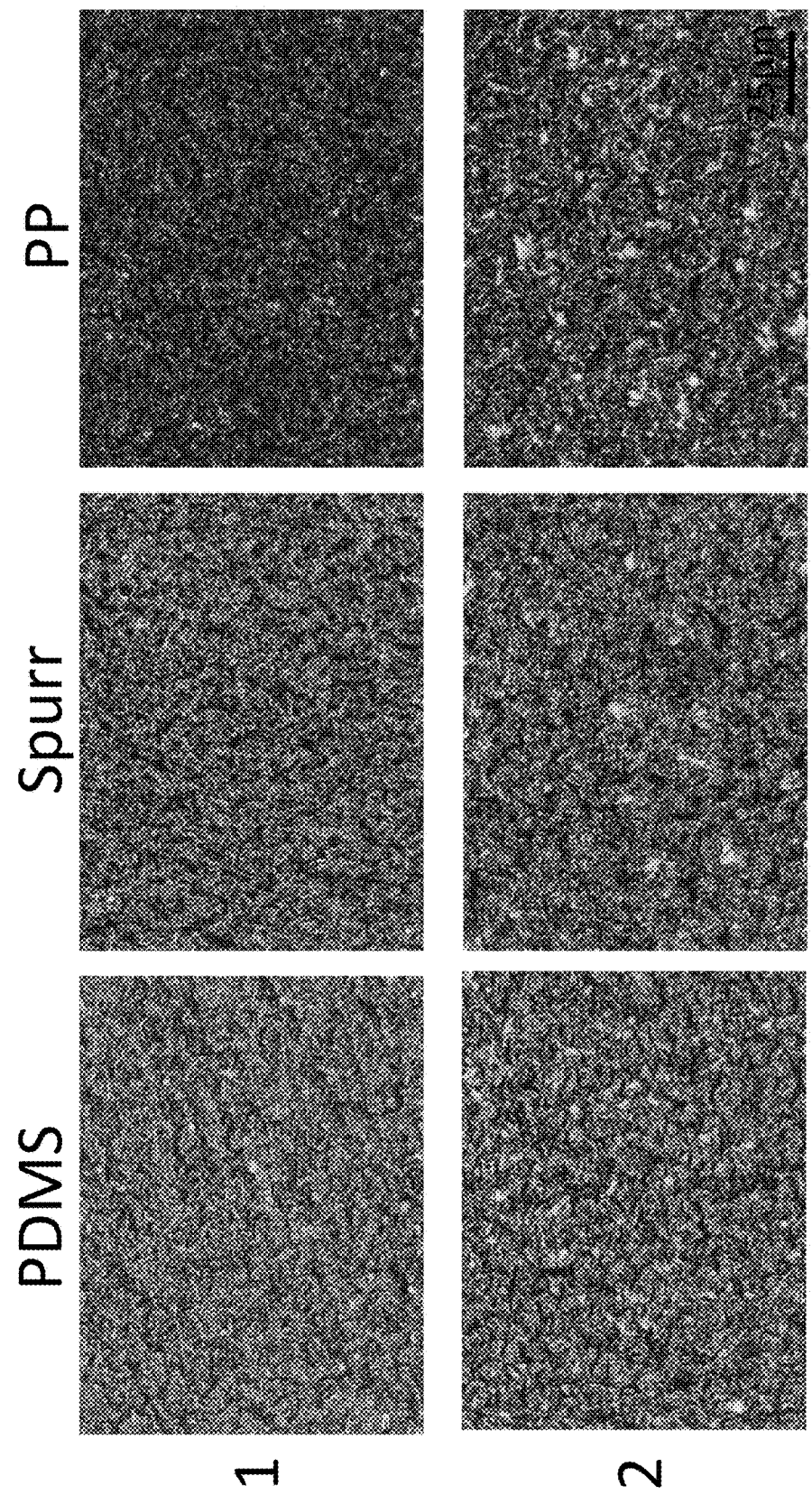
FIG. 4 shows a comparison of SH surfaces on a first surface (polydimethylsiloxane, PDMS), a master (Spurr), and a hard plastic (e.g., polypropylene, PP).

In some embodiments, the ratio of components in spurr is optimized and spurr's strength is increased to improve its capabilities as a shim. The superhydrophobicity of spurr and SH features can be imprinted into a coating of spurr. FIG. 4 shows two exemplary electron micrographs comparing SH surfaces on two different types of master shims, polydimethylsiloxane (PDMS) and Spurr, and an embossed plastic (polypropylene, PP). The surfaces of the master PDMS and Spurr master shims and the polypropylene product all have the micro-scaled and nano-scaled features characteristic of a SH surface.

Advantages of Structural Modification

Our structural modification based SH surfaces are better than chemical modification because the superhydrophobic effect does not wear off over time or leach into the environment. The features do not need to adhere to a surface and therefore are not dependent on chemical adherence of chemicals to the surface. The features can be imprinted into any inherently hydrophobic plastic, and our device can potentially undergo less FDA scrutiny (if the features are stamped into an already FDA-approved plastic). Our features yield superhydrophobicity and can be used for superhydrophobic applications including anti-fouling, medical applications, fluid transport, and efficiency. This scale-up manufacturing method negates using complex, static fabrication techniques.

The disclosed methods provide a scaled-up technology that is compatible with roll-to-roll manufacturing. We have deposited metal in a flatbed method compatible with roll-to-roll deposition equipment. Ormocer successful molds PDMS templates and embossing into hard plastics is characterized. In some embodiments, the Ormocer can be placed directly onto a roll-to-roll shim. We have successfully molded SH PDMS with spurr, achieved SH Spurr, and have molded SH Spurr with PP to achieve SH PP.

The technology disclosed herein provides a basis for numerous applications and products. Example applications include articles having one or more surface that is self-cleaning, anti-bacterial, anti-wetting, anti-icing, anti-corrosion, antifogging, anti-fouling, drag reducing, anti-reflecting, articles used in valving and in surface treatment. Example products include windows, clothing, boats, interior and exterior surfaces of refrigerators, interior and/or external surfaces of tubing, cooling systems, solar cells, microfluidics devices and point of care (POC) articles.

Figure 5:
FIG. 5 shows one of many products that can be formed with an SH surface. The product is a component of one embodiment of an educational kit being developed by A Hundred Tiny Hands. In particular, the kit includes a SuperHydroTension Toolbox with an SH surface. The methods herein enable mass production of shrink-induced SH surfaces. SuperHydroTension uses SH surfaces to educate students about surface tension, surface energy, nanotechnology, and fabrication. The students are taught about the properties of water.

We presently make superhydrophobic surfaces for our A Hundred Tiny Hands education kits (FIG. 5), which uses SH surfaces to teach kids about surface tension, surface energy, nanotechnology, and fabrication. It also provides a basis for food packaging companies to wrap products in the superhydrophobic films.

Lab-on-Chip Devices

Figure 6:
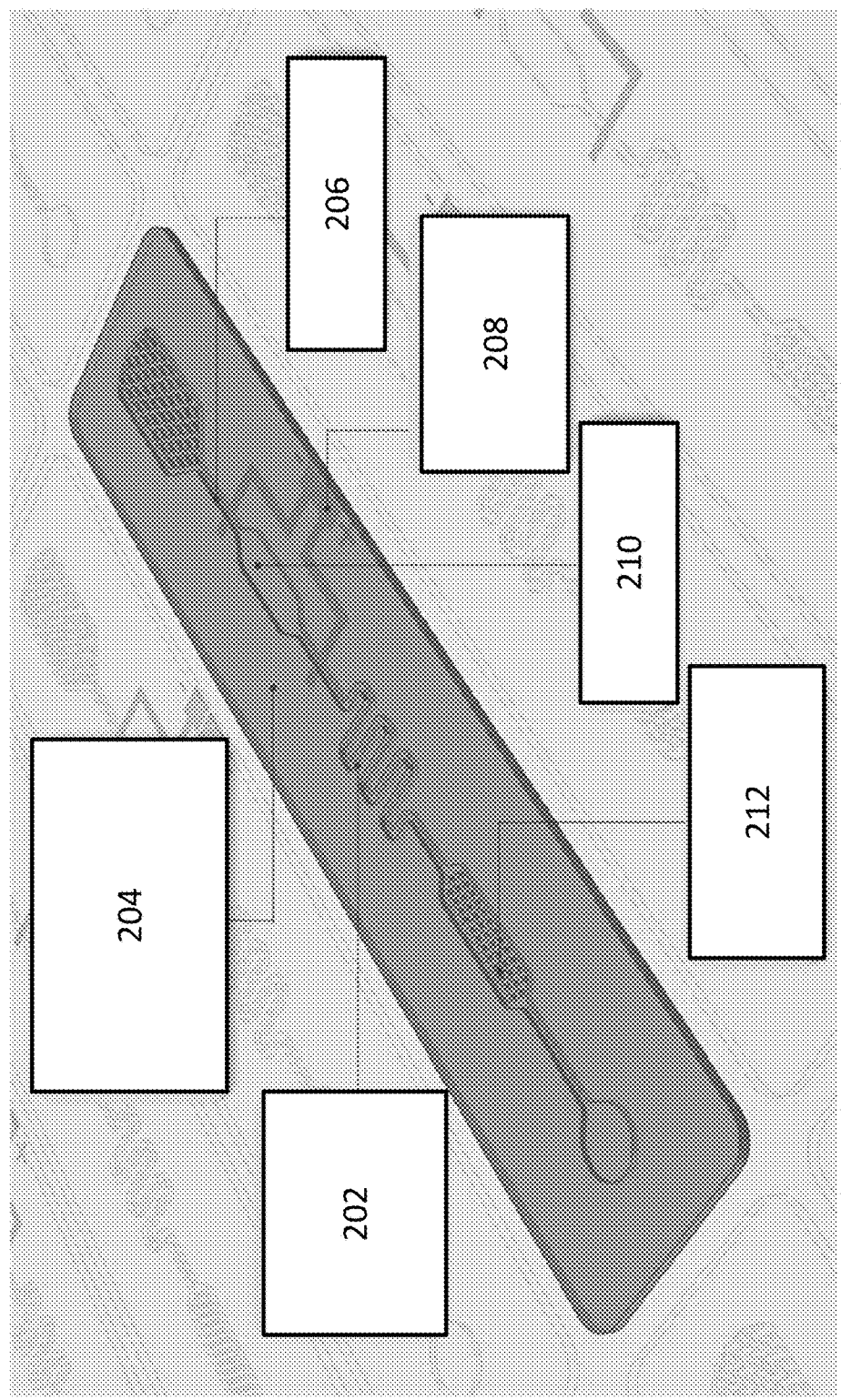
FIG. 6 shows an embodiment of a microfluidic device containing SH surface(s).

Using the methods disclosed herein, manufacture of disposable lab-on-chip devices or point of care devices (FIG. 6) is economically feasible. For instance, roll-to-roll printing technologies are employed using flexible substrates and compatible product materials 204 (e.g., Polymethylmethacrylate (PMMA) (Acrylic); cyclic olefin copolymer (COC), cyclic olefin polymer (COP), polycarbonate (PC) and polyvinyl chloride acetate (PVCA). Multiple chips can be mass manufactured.

Such devices may employ fluidics channels, capillary pumps, mixers, reaction chambers and blister packs for liquid storage (202). Biomolecules (212) may be immobilized, e.g., using ink-jet printing or dispensing. Such lab-on-chip devices permit qualitative or quantitative detection of analytes (210). The devices may be used in combination with electronics and/or optics components (208), e.g., OLED light sources, batteries, connectors, antennas and electrodes. In addition to containing SH surfaces, other surfaces of the devices may contain other types of surface modification, e.g., chemical surface modification (206). In some instances, the surface modification can produce hydrophobic and/or hydrophilic surfaces.

A lab-on-chip device can be manufactured by laminating multiple layers of compatible materials together, wherein the layers provide various functions or geometries, including geometric shapes and/or gaps (e.g., to form channels) and/or contain surface modifications, such as imprinting of SH features onto at least one surface and/or modifications that result in at least one surface being hydrophilic, attachment of biomolecules, and the like.

EXAMPLE 1

Fabrication of Superhydrophobic Surfaces

Figure 7:
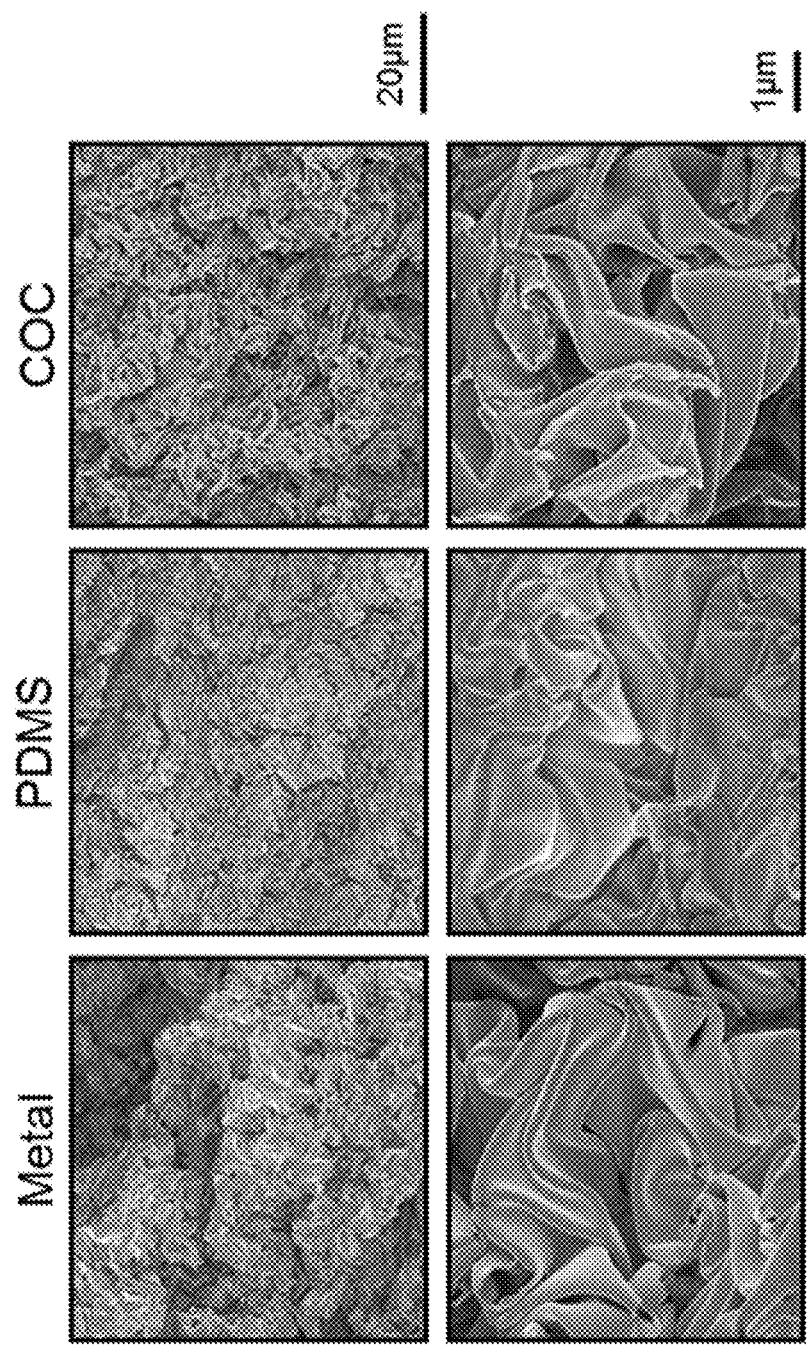
FIG. 7 includes electron micrographs of SH surfaces of a metal, an epoxy master (PDMS) and an imprinted substrate (COC).

Superhydrophobic surfaces were created on an area of about 1"×1." Gold was sputter-coated onto a 4"×4" shrinkable polyolefin (PO) substrate. A SH surface was created by heat shrinking the polymer substrate and the metal deposited thereupon at 160° C., thereby producing a surface having micro- and nano-scale features that trap air pockets and prevent water from wetting the surface. A master was formed by molding an epoxy with the shrunken surface having a SH surface, wherein the master acquired the SH features. The SH features of the master were then imprinted onto a second surface to impart the SH features of the master onto the second surface. The fabrication method is depicted in FIG. 1 and electron micrographs of SH surfaces of a metal, an epoxy master (e.g., PDMS) and an imprinted surface (COC) are depicted in FIG. 7.

EXAMPLE 2

Mass Manufacturing by Roll-to-Roll Platform

A roll of shrink film is placed in a roll-to-roll metal evaporation system. Silver and calcium targets are loaded into the evaporation chamber, and the entire system is vacuumed. The first evaporation chamber is heated to evaporate and deposit silver on the shrink film. The roll of shrink film is rolled into the evaporation region at the correct speed to allow the correct thickness of silver deposition. The second evaporation chamber is also heated, and calcium is deposited on the surface using the same technique. Thickness is controlled by the speed of the film and is monitored by a film thickness crystal. Once the metal is completely deposited, the chambers are cooled, and the rolls are stopped. The system is brought back to room pressure, and the rolls are transferred to a nitrogen glove box.

At this point, the shrink film roll carrying the evaporated metal layers is cut to size, and the film is heated, allowing the plastic to shrink and create the superhydrophobic features. Once the superhydrophobic features are fully expressed (e.g., the shrink film has reached its maximum shrunk state), a PDMS copy is made out of the superhydrophobic surface features. This PDMS copy was used to cast features into a special negative tone photoresist (Ormocer, Microresist GmbH, Germany). To achieve a high quality copy of the PDMS features, Ormocer was dissolved in solution, held under vacuum, and placed on a backing to properly mold the PDMS template. Next, the structure formed of the ormocer when fully cured, separated from the PDMS and mounted to a roller, was used as a shim to imprint superhydrophobic features by roll-to-roll hot embossing.

EXAMPLE 3

Transfer of SH Features onto Product Surfaces

A silver layer was sputter coated onto pre-stressed polystyrene (PS). This was followed by deposition of a calcium layer on the silver layer. The ratio of the thickness of silver layer to the thickness of the calcium layer was 4:1. The PS substrate with Ag/Ca coating was heat shrunk, resulting in SH structural features, due to folding of the Ag/Ca double layer. A SH master shim was created as described above.

Figure 8:
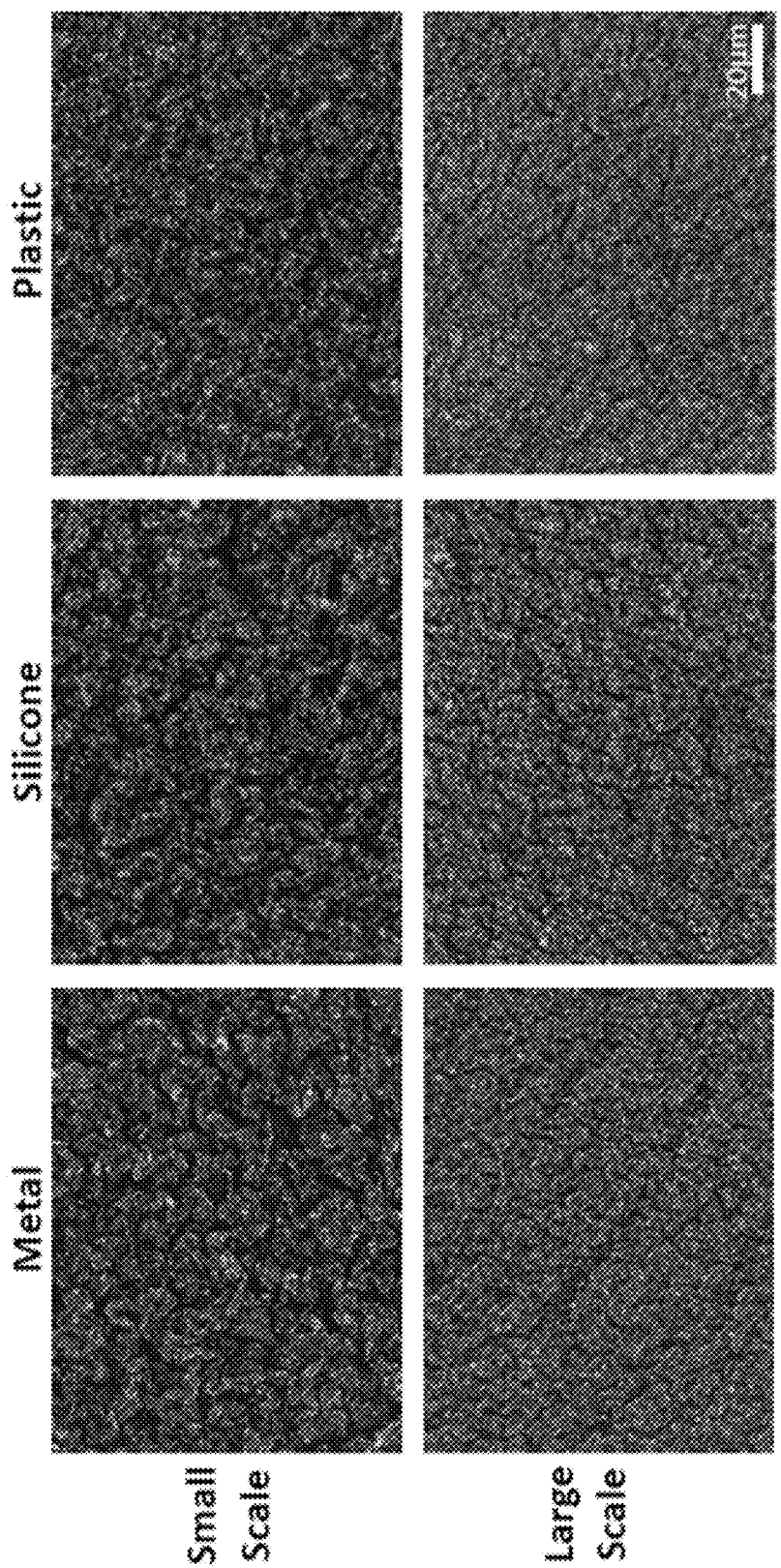
FIG. 8 includes magnified images of a first SH surface (Metal), and two different imprinted second surfaces (Silicone and Plastic). SH features are successfully transferred by SH master imprinting onto the product surfaces, e.g., hot embossing, by small scale and large scale (e.g., R2R deposition) onto the silicone and plastic surfaces.
Figure 9:
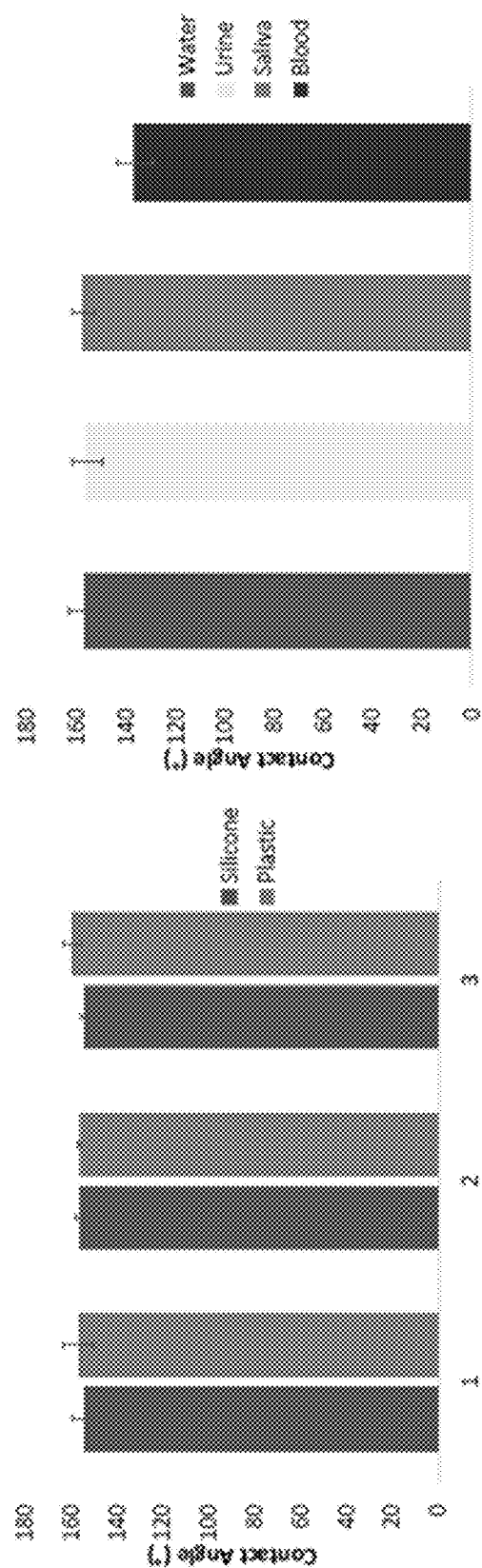
FIG. 9 shows contact angle values for large scale manufactured surfaces in silicone and hard plastic. To deposit a rigid surface onto a heat sensitive surface, silver and then calcium were deposited onto the heat sensitive surface, using 3 different ratios of silver to calcium, e.g., using a ratio of 4:1. The different ratios of silver to calcium tested produced comparable contact angles. The right-hand graph shows that the SH surfaces imprinted in silicone are superhydrophobic with regard to bodily fluids, such as urine, saliva and blood.

SH features were successfully transferred by SH master imprinting onto product surfaces by small scale and large scale (R2R deposition) hot embossing onto silicone and hard plastic surfaces (FIG. 8). Contact angle values were measured for large scale manufactured surfaces in silicone and hard plastic for 3 different metal deposition conditions, wherein the ratio of silver to calcium was varied (FIG. 9). The various surfaces were found to be SH, exhibiting contact angles of greater than 150° in relation to water, and exhibiting contact angles in relation to bodily fluids such as saliva and urine of between 140°-160°.

EXAMPLE 4

Evaporation on SH Surfaces Enhances Analyte Detection Sensitivity

Figure 10:
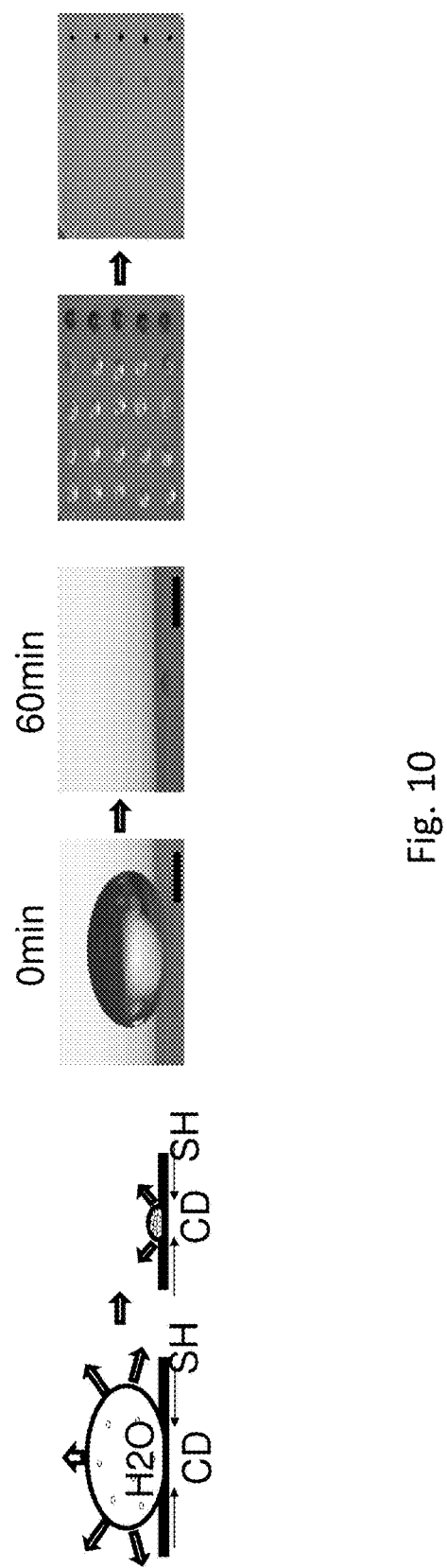
FIG. 10 shows how a reduction in volume and contact diameter ("CD") as well as the concentration of particles in food dye results on a SH surface. Color intensity increases as molecules evaporate and concentrate over a period of 60 minutes. Scale bars showing droplet size are 500 µm.

We have observed that a reduction in volume and contact diameter on a SH surface, as disclosed herein, increases analyte detection. A food dye, used as a prototype analyte, was dissolved in water. The concentration of the food dye was substantially increased upon evaporation on the SH surface. Color intensity increases as molecules evaporate and concentrate over a period of 60 minutes (FIG. 10), thereby significantly enhancing detection.

Figure 11:
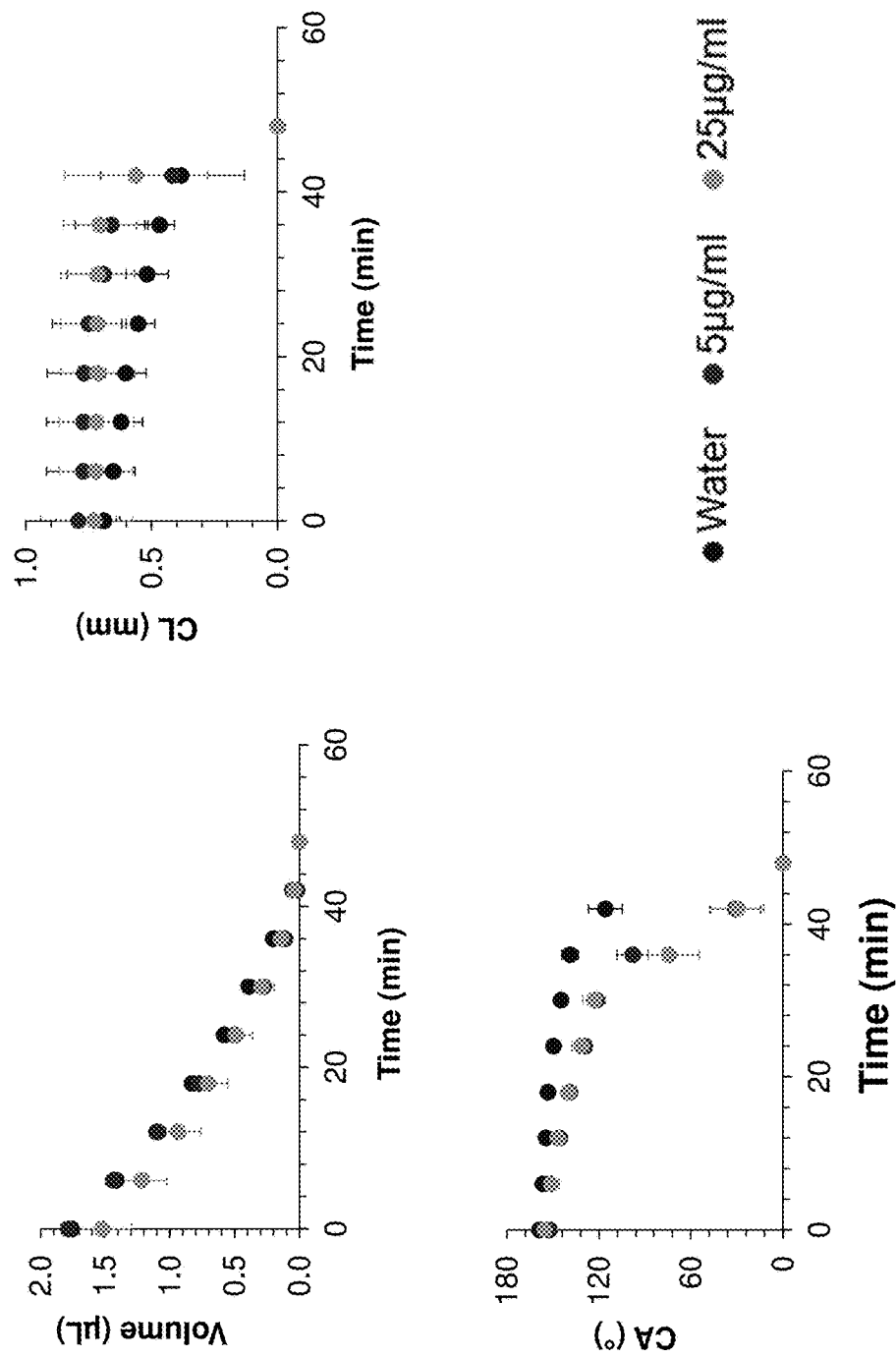
FIG. 11 shows how water and BSA evaporate on a SH surface, and particles concentrate. Volume, contact length (CL), and contact angle (CA) of 2 µl of 5 µg/mL BSA and 25 µg/mL BSA are compared with 2 µl of water as the droplet evaporates over time. All measurements are taken at room temperature with ambient humidity.

Water and BSA evaporate on a SH surface, concentrating the BSA and enhancing det. Volume, contact length (CL), and contact angle (CA) of 2 µl of 5 µg/mL BSA and 25 µg/mL BSA in water were compared with 2 µl of water as the droplet evaporates over time. All measurements were taken at room temperature with ambient humidity. Referring to FIG. 11, the volume, CL and CA decreased over time.

Figure 12:
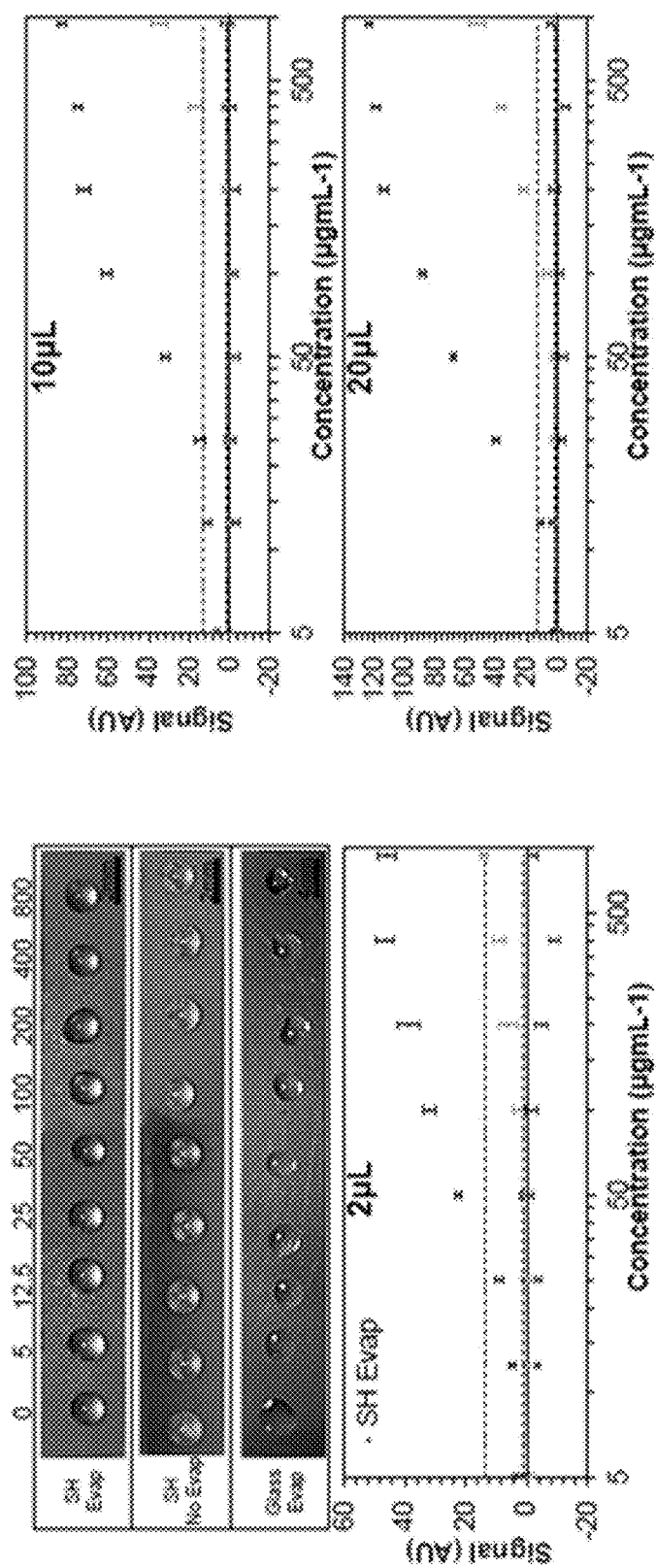
FIG. 12 illustrates how evaporation on a SH surface improves protein detection sensitivity. A colorimetric signal is quantified with a 20 µL droplet. Protein is detected in droplets on an SH surface (with and without evaporation) and in droplets on glass following evaporation. Lighting and imaging conditions are controlled for all measurements. Values represent the signal minus the 0 min time point. Greater signals are detected using the SH surface following evaporation.

Evaporation on a SH surface improves protein detection sensitivity. A colorimetric signal was quantified with a 20 µL droplet. Protein was detected in droplets on an SH surface (with and without evaporation) and in droplets on glass following evaporation. Lighting and imaging conditions are controlled for all measurements (see FIG. 12). Greater signals were detected using the SH surface following evaporation.

Figure 13:
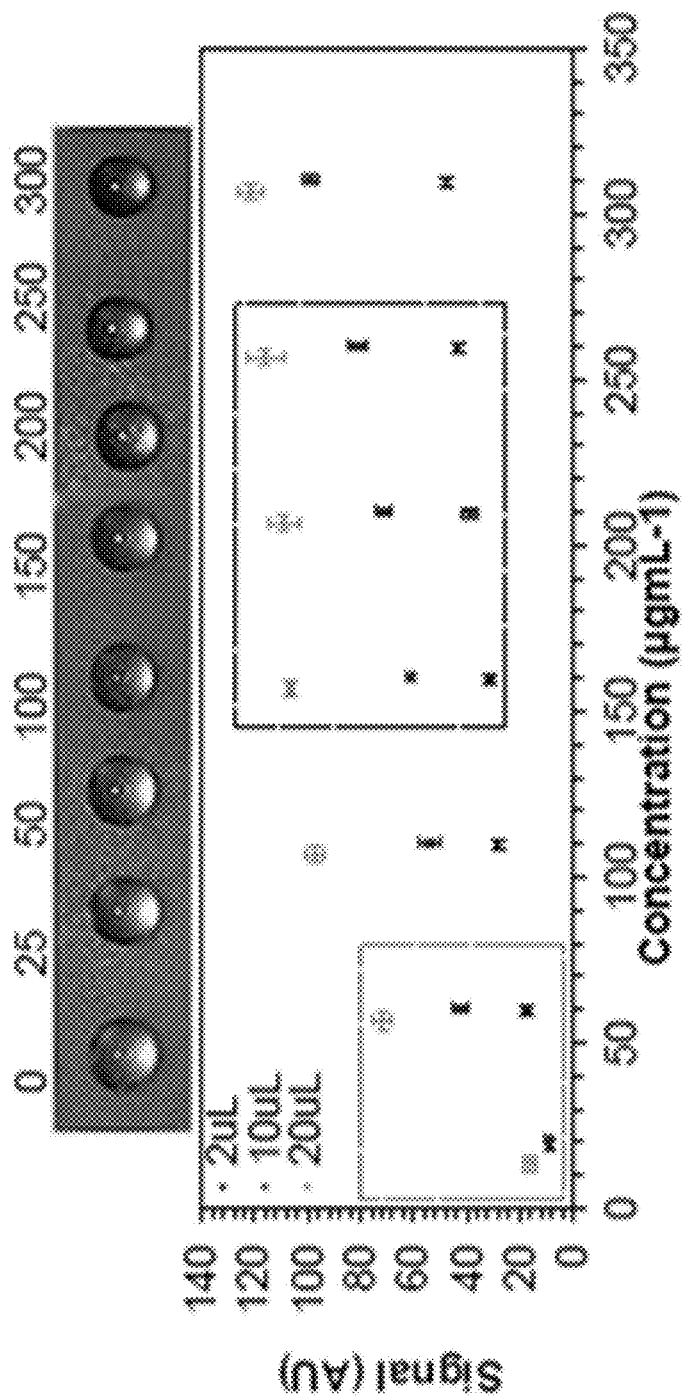
FIG. 13 shows BSA mixed with urine is detectable and distinguishable using evaporation on a SH surface. Protein levels indicative of normal (box on the left of the figure, in dashed grey) and pre-eclampsia (box toward the right of the figure, in dashed black) are shown.

BSA spiked in urine was detectable and distinguishable using evaporation on a SH surface (see FIG. 13).

EXAMPLE 5

Antibacterial Surfaces

Figure 14:
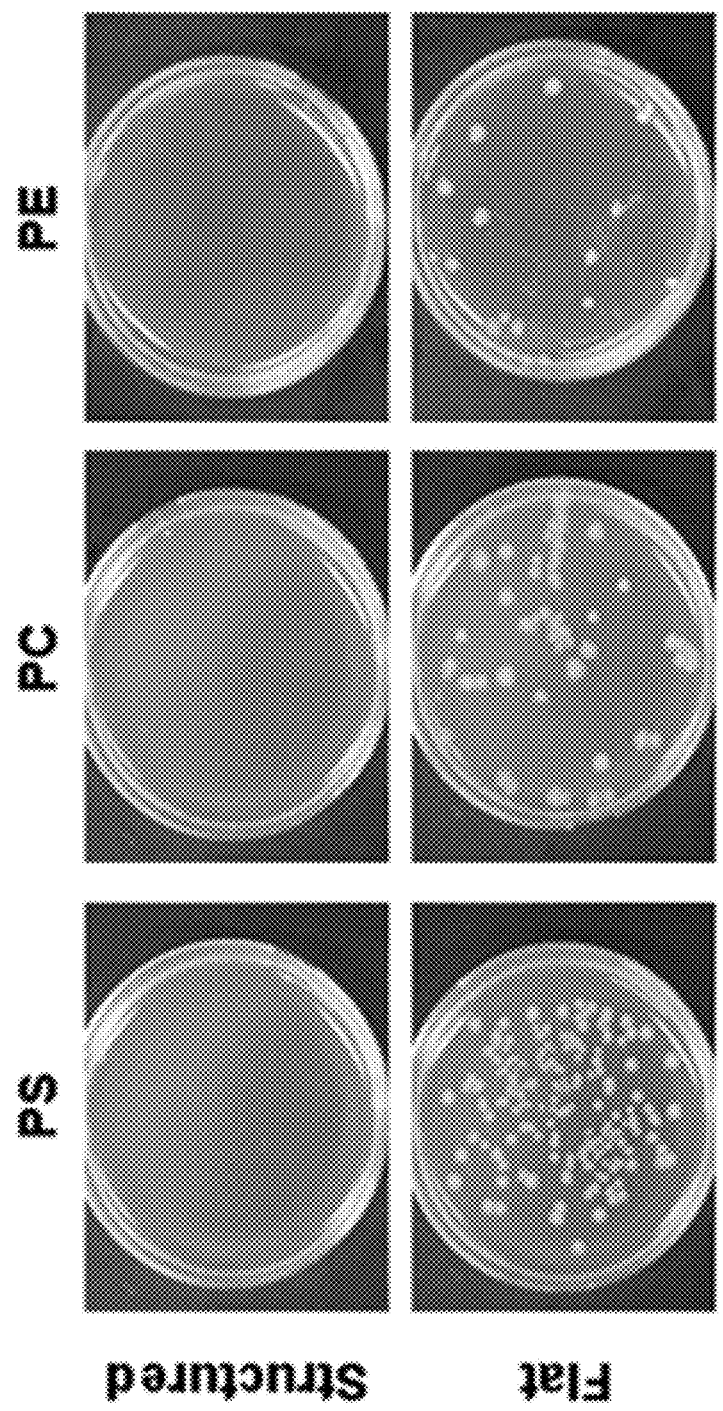
FIG. 14 shows how structured surfaces (with SH features) are antibacterial while corresponding flat surfaces (without SH features) are not antibacterial. The Structures surfaces were provided in polystyrene (PS), polycarbonate (PC), and polyethylene (PE).

Polystyrene (PS), Polycarbonate (PC) and Polyethylene (PE) surfaces were tested for bacterial permissiveness. Flat and SH surfaces (Structured) prepared from the PS, PC and PE were contacted with bacterial and then rinsed with phosphate buffered saline (PBS). The surfaces were then tested for presence of bacteria by contacting the SH and flat surfaces onto nutrient agar to transfer any bound bacteria to the nutrient agar. The nutrient agar was then incubated to allow growth of bacterial colonies where bacteria were transferred to the nutrient agar. Referring to FIG. 14, the SH surfaces did not have bacteria attached their surfaces, resulting in no detectable colonies, while the flat surfaces did have adherent bacteria, which became transferred to the nutrient agar and developed bacterial colonies. The data show that the bacteria did not adhere to the SH surfaces as they did to the flat surfaces.

While the present description sets forth specific details of various embodiments, it will be appreciated that the description is illustrative only and should not be construed in any way as limiting. Furthermore, various applications of such embodiments and modifications thereto, which may occur to those who are skilled in the art, are also encompassed by the general concepts described herein. Each and every feature described herein, and each and every combination of two or more of such features, is included within the scope of the present invention provided that the features included in such a combination are not mutually inconsistent.

Some embodiments have been described in connection with the accompanying drawings. However, it should be understood that the figures are not drawn to scale. Distances, angles, etc. are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments can be used in all other embodiments set forth herein. Additionally, it will be recognized that any methods described herein may be practiced using any device suitable for performing the recited steps.

For purposes of this disclosure, certain aspects, advantages, and novel features are described herein. It is to be understood that not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Although these inventions have been disclosed in the context of certain preferred embodiments and examples, it will be understood by those skilled in the art that the present inventions extend beyond the specifically disclosed embodiments to other alternative embodiments and/or uses of the inventions and obvious modifications and equivalents thereof. In addition, while several variations of the inventions have been shown and described in detail, other modifications, which are within the scope of these inventions, will be readily apparent to those of skill in the art based upon this disclosure. It is also contemplated that various combination or sub-combinations of the specific features and aspects of the embodiments may be made and still fall within the scope of the inventions. It should be understood that various features and aspects of the disclosed embodiments can be combined with or substituted for one another in order to form varying modes of the disclosed inventions. Further, the actions of the disclosed processes and methods may be modified in any manner, including by reordering actions and/or inserting additional actions and/or deleting actions. Thus, it is intended that the scope of at least some of the present inventions herein disclosed should not be limited by the particular disclosed embodiments described above. The limitations in the claims are to be interpreted broadly based on the language employed in the claims and not limited to the examples described in the present specification or during the prosecution of the application, which examples are to be construed as non-exclusive.

What is claimed is:

1. A method of manufacturing a superhydrophobic (SH) surface comprising:
   creating a master with SH features by:
      depositing a rigid material onto a first surface, wherein said rigid material comprises a first layer comprising a first metal and a second layer comprising a second metal, wherein one of the first and second layers is solid calcium, wherein the first surface is a shrinkable platform;
      shrinking the first surface by heating to create a SH surface, wherein the SH features comprise micro- and nano-scale structures that trap air pockets and prevent water from wetting the surface;
      forming the master by contacting a master material with the shrunken first surface having a SH surface and hardening the master material while in contact with the shrunken first surface, wherein master material solidifies and acquires the SH features of the first surface; and
   imprinting the SH features of the master onto a second surface to impart the SH features of the master onto the second surface.

2. The method of claim 1, wherein one of the first and second layers is gold or silver.

3. The method of claim 1, wherein said rigid material comprises a bimetallic layer comprising a layer of silver deposited on the first surface and a layer of solid calcium deposited on the layer of silver.

4. The method of claim 1, wherein said rigid material is vapor-deposited onto the first surface.

5. The method of claim 1, wherein the master material is selected from the group consisting of nickel, polydimethylsiloxane (PDMS), ormocer and spurr.

6. The method of claim 1, wherein the master is formed by electroplating nickel onto the SH surface.

7. The method of claim 1, wherein said imprinting is done by hot embossing of the second surface with the master.

8. The method of claim 1, wherein the first surface is a polyolefin (PO).

9. The method of claim 1, wherein the second surface is a hard plastic.

10. The method of claim 1, wherein a master is repetitively imprinted onto the second surface at adjacent positions to seamlessly transfer the SH features of the master to the second surface.

11. The method of claim 1, wherein the SH features of a master are imprinted onto the second surface by roll-to-roll processing.

* * * * *